(12) United States Patent
Ishida et al.

(10) Patent No.: US 6,339,014 B1
(45) Date of Patent: Jan. 15, 2002

(54) METHOD FOR GROWING NITRIDE COMPOUND SEMICONDUCTOR

(75) Inventors: Masahiro Ishida; Masaaki Yuri; Osamu Imafuji, all of Osaka; Tadao Hashimoto, Hyogo; Kenji Orita, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/289,960

(22) Filed: Apr. 13, 1999

(30) Foreign Application Priority Data

Apr. 14, 1998 (JP) .............................................. 10-102355

(51) Int. Cl.$^7$ .......................... H01L 21/20; H01L 21/36
(52) U.S. Cl. ...................... 438/503; 438/509; 257/103
(58) Field of Search .................................. 438/458, 481, 438/502, 503, 507, 509, 46, 479, 796; 437/21, 84, 86; 257/86, 94, 103, 607, 96, 97, 102

(56) References Cited

U.S. PATENT DOCUMENTS

| | | | |
|---|---|---|---|
| 5,122,845 A | | 6/1992 | Manabe et al. ................ 257/76 |
| 5,290,393 A | * | 3/1994 | Nakamura ................... 438/509 |
| 5,689,123 A | | 11/1997 | Major et al. ................. 257/190 |
| 5,693,963 A | | 12/1997 | Fujimoto et al. ............. 257/94 |
| 5,825,052 A | * | 10/1998 | Shakuda ....................... 257/94 |
| 5,846,844 A | * | 12/1998 | Akasaki et al. ............... 437/21 |
| 6,017,807 A | * | 1/2000 | Furukawa et al. .......... 438/502 |
| 6,051,847 A | * | 4/2000 | Oku et al. ..................... 257/94 |
| 6,071,795 A | * | 6/2000 | Cheung et al. ............. 438/458 |
| 6,232,623 B1 | * | 5/2001 | Morita ........................ 257/103 |

FOREIGN PATENT DOCUMENTS

| | | |
|---|---|---|
| EP | 0 772 249 | 5/1997 |
| EP | 0871228 | * 8/1998 |
| EP | 0871228 A2 | 10/1998 |
| JP | 2-229476 | 9/1990 |
| JP | 7-312350 | 11/1995 |
| JP | 8-8217 | 1/1996 |
| JP | 10-341036 | 12/1998 |
| WO | WO97/13891 | 4/1997 |
| WO | WO99/05728 | 2/1999 |

OTHER PUBLICATIONS

European Search Report dated Oct. 28, 1999.
High Pressure Growth of GaN—New Prospects for Blue Lasers, Journal of Crystal Growth, vol. 166, No. 1, Sep. 1, 1996, pp. 583–589, S. Porowski.
Growth and Properties of Single Crystalline GaN Substrates and Homepitaxial Layers, Materials Science and Engineering B, Vol. 44, No. 1–3, Feb. 1, 1997, pp. 407–413, S. Porowski.
Blue Light–Emitting Diodes on Gan Substrates, Growth and Characterization, Journal of Crystal Growth, vol. 189/190, Jun. 2, 1998, pp. 167–171, A. Pelzmann et al.

* cited by examiner

Primary Examiner—David Nelms
Assistant Examiner—Phuc T. Dang
(74) Attorney, Agent, or Firm—Eric J. Robinson; Nixon Peabody LLP

(57) ABSTRACT

A method for growing a nitride compound semiconductor according to the present invention includes the step of growing a compound semiconductor expressed by a general formula $Al_xGa_{1-x}N$ (where $0 \leq x \leq 1$) on a nitride compound semiconductor substrate at a temperature of about 900° C. or more.

14 Claims, 4 Drawing Sheets

METHOD FOR GROWING NITRIDE COMPOUND SEMICONDUCTOR

BACKGROUND OF THE INVENTION

The present invention relates to a method for growing a nitride compound semiconductor.

Nitride compound semiconductors are used as materials for various types of semiconductor devices including blue-light-emitting semiconductor laser diodes. To improve the reliability and performance of a semiconductor device using a nitride compound semiconductor, a nitride compound semiconductor of excellent crystallinity must be grown on a substrate. In a prior art method, an AlN buffer layer is first grown on a sapphire substrate at a growth temperature in the range from 400° C. to 900° C., both inclusive, and then a nitride compound semiconductor is grown thereon (see Japanese Laid-Open Publication No. 2-22947, for example). In another prior art method, an AlGaN buffer layer is first grown on a sapphire substrate at a growth temperature in the range from 200° C. to 900° C., both inclusive, and then a nitride compound semiconductor is grown thereon (see Japanese Laid-Open Publication No. 7-312350 and Japanese Publication for opposition No. 8-8217, for example).

According to any of these methods, a polycrystalline buffer layer is grown on a sapphire substrate at a low temperature, which is then raised to change part of the buffer layer into single crystals. In that single crystalline part of the buffer layer, seed crystals with a satisfactorily aligned orientation are formed, and a nitride compound semiconductor is grown thereon using these seed crystals as nuclei of crystal growth. As the crystals grow, each of these nuclei grows larger and larger to impinge on an adjacent nucleus at last. In this case, since a pair of adjacent nuclei have an aligned orientation, these nuclei are combined to form one single crystal after the impingement. In this manner, nitride compound semiconductor crystals grow.

The present inventors analyzed in detail the cross section of nitride compound semiconductor crystals, which had been grown on a buffer layer formed on a sapphire substrate at a low temperature in accordance with the conventional method, using a transmission electron microscope. As a result, we found that although almost no defects were observed in the substrate, defects had developed from the interface between the substrate and the nitride compound semiconductor crystals in the buffer layer. Specifically, an enormous number of defects were observed in the nitride compound semiconductor crystals at a dislocation density in the range from about $1 \times 10^9$ cm$^{-2}$ to about $1 \times 10^{11}$ cm$^{-2}$. We believe that these defects are caused because when the growing nuclei are impinging on each other around that part of the buffer layer where single crystals have been formed, the crystal orientations and stacking heights thereof slightly deviate from each other at an atomic level and the nitride compound semiconductor crystals grow with these deviations left as crystal defects therein. If a semiconductor device is fabricated using these nitride compound semiconductor crystals where such defects exist, each of these defects functions as the non-radiative center at which carriers are trapped. As a result, the reliability of the device is seriously affected. For example, the emission efficiency decreases or the device is broken down because of these defects. Also, in growing nitride compound semiconductor crystals on a sapphire substrate, on and after the thickness of the grown layer reaches a critical value, the substrate is adversely cracked during a process of lowering the temperature of the substrate from a growth temperature to room temperature. This is due to a difference in thermal expansion coefficient between the substrate and the grown layer.

As can be understood, defects are almost always generated in a nitride compound semiconductor grown by the conventional method. Thus, an improved crystal growing method that can obviate such defects is required to further improve the performance and reliability of a semiconductor device using a nitride compound semiconductor.

SUMMARY OF THE INVENTION

An object of the present invention is providing a method for growing a nitride compound semiconductor on a substrate with these defects substantially obviated.

A method for growing a nitride compound semiconductor according to the present invention includes the step of growing a compound semiconductor expressed by a general formula $Al_xGa_{1-x}N$ (where $0 \leq x \leq 1$) on a nitride compound semiconductor substrate at a temperature of about 900° C. or more.

Another method for growing a nitride compound semiconductor according to the present invention includes the step of growing a compound semiconductor expressed by a general formula $In_yAl_zGa_{1-y-z}N$ (where $0<y \leq 1$, $0 \leq z<1$ and $0 \leq y+z \leq 1$) on a nitride compound semiconductor substrate at a temperature of about 700° C. or more.

In one embodiment of the present invention, a dislocation density in the substrate is preferably about $1 \times 10^6$ cm$^{-2}$ or less.

In another embodiment, the thickness of the substrate is preferably about 30 µm or more.

In still another embodiment, either arsenic or a compound containing arsenic may be supplied onto the substrate while the compound semiconductor is being grown on the substrate.

In still another embodiment, either phosphorus or a compound containing phosphorus may be supplied onto the substrate while the compound semiconductor is being grown on the substrate.

DESCRIPTION OF THE PREFERRED EMBODIMENTS

Hereinafter, preferred embodiments of the present invention will be described with reference to the accompanying drawings.

EMBODIMENT 1

In accordance with a growing method according to a first exemplary embodiment of the present invention, a compound semiconductor, expressed by a general formula $Al_xGa_{1-x}N$ (where $0 \leq x \leq 1$), is grown on a nitride compound semiconductor substrate.

Figure 1:
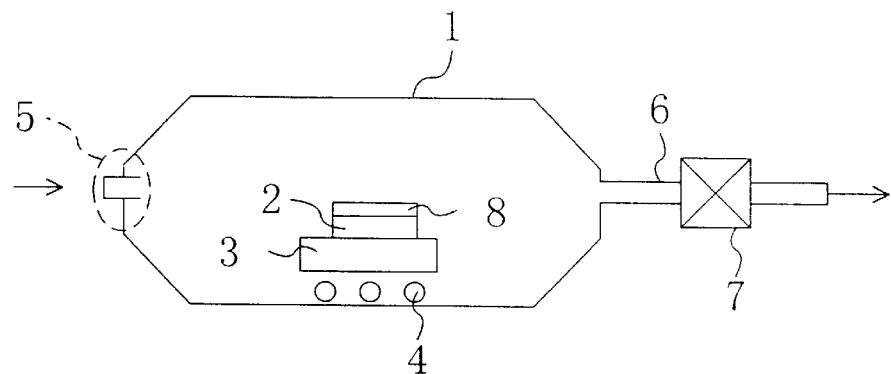
FIG. 1 is a cross-sectional view schematically illustrating a metalorganic chemical vapor deposition apparatus used in an embodiment of the present invention.

FIG. 1 is a cross-sectional view schematically illustrating part of a metalorganic chemical vapor deposition (MOCVD) apparatus including a reactor used in a method for growing a compound semiconductor according to the present invention.

As shown in FIG. 1, a susceptor 3 for holding a substrate 2 thereon is disposed inside a reactor 1, and is heated by a heater 4. A source gas and a carrier gas (e.g., $H_2$) are supplied through a gas inlet port 5 into the reactor 1 and a laminar flow is generated over the susceptor 3. A pressure controller 7 is connected to the reactor 1 via an exhaust pipe 6, thereby exhausting the supplied gases to the outside and controlling the pressure inside the reactor 1.

In this exemplary embodiment, the horizontal reactor 1, in which the reactive gas flows in parallel to the substrate 2 is used. Alternatively, a vertical reactor, in which a reactive gas flows vertically, may also be used so long as a laminar flow is obtained over the substrate. Also, the $H_2$ gas may be replaced with $N_2$ gas or a rare gas as the carrier gas.

Hereinafter, a method for growing GaN crystals on a GaN or $Al_{0.2}Ga_{0.8}N$ substrate by an MOCVD process will be described for the illustrative purpose.

First, a cleaned single crystalline substrate 2 made of GaN or $Al_{0.2}Ga_{0.8}N$ is placed on the susceptor 3 as shown in FIG. 1. Then, while the $H_2$ gas is being supplied through the gas inlet port 5 into the reactor 1, the susceptor 3 is heated by the heater 4 up to about 1000° C. and then the stabilization of the temperature is waited. Next, trimethylgallium and ammonium are added to the $H_2$ gas as Group III source and Group V source, respectively, through the gas inlet port 5, and the mixed gas is supplied for 60 minutes, thereby epitaxially growing a GaN layer (grown layer) 8 to be 2 $\mu$m thick on the substrate 2 at a reduced pressure of 10 kPa. The flow rates of trimethylgallium and ammonium are set at 50 $\mu$mol/min. and 200 $\mu$mmol/min., respectively. The upper limit of the growth temperature may be arbitrarily defined so long as the limit is lower than the decomposition temperature of GaN, which is variable with pressure. At the ambient pressure, the decomposition temperature of GaN is about 1100° C.

The single crystalline substrate of GaN or $Al_{0.2}Ga_{0.8}N$ may be obtained by the following method, for example. First, a crystal layer of GaN or $Al_{0.2}Ga_{0.8}N$ is grown on a sapphire substrate or the like by MOCVD, MBE or chloride vapor phase epitaxy (VPE). Next, the resulting crystal layer is thermally annealed, if necessary, thereby improving the crystallinity thereof. Then, the sapphire substrate is removed by an etching technique, for example. Regarding a method for forming a single crystalline nitride compound semiconductor substrate employed in the present invention, Japanese Patent Application No. 10-75295 and its corresponding U.S. patent application Ser. No. 09/056,500 is hereby incorporated by reference. The nitride compound semiconductor substrate used in the crystal growing method of the present invention may be formed by any other method.

For the purpose of comparison, a GaN buffer layer was grown to be 0.05 $\mu$m thick on a sapphire substrate at about 600° C. in accordance with a conventional crystal growing technique, and then the growth temperature was raised up to about 1000° C., thereby growing a GaN layer to be 2 $\mu$m thick on the GaN buffer layer.

Figure 2:
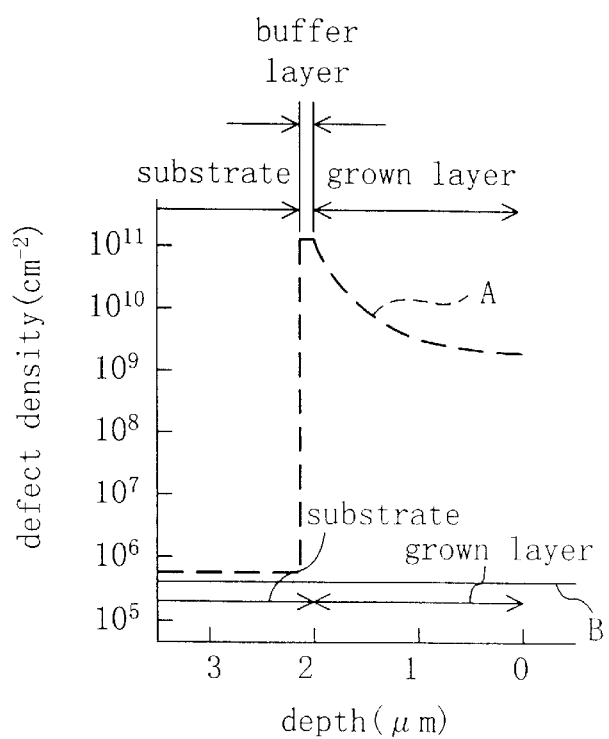
FIG. 2 is a graph illustrating in comparison how the defect density is distributed in the depth direction in a GaN layer, grown by the method of the present invention, and a GaN layer grown on a sapphire substrate by a conventional method.

FIG. 2 illustrating the results obtained by measuring the distribution of defect density in the depth direction in a GaN layer directly grown on a GaN or $Al_{0.2}Ga_{0.8}N$ substrate at about 1000° C. and that in a GaN layer grown on a buffer layer on a sapphire substrate with the respective cross sections analyzed by transmission electron microscopy. As indicated by the dashed line A in FIG. 2, in the GaN layer grown on the buffer layer grown at a low temperature, a large number to of defects are caused in the vicinity of the buffer layer, and part of the defects do not disappear but reach the surface. In contrast, as indicated by the solid line B in FIG. 2, in the GaN layer grown on the GaN or $Al_{0.2}Ga_{0.8}N$ substrate, the defect density is not different between the substrate and the grown layer. As can be understood, many defects are caused in a grown layer on a buffer layer grown at a low temperature, whereas the number of defects in the interface between the substrate and the grown layer can be drastically cut down according to the present invention. In addition, a defect density in the grown layer can also be sufficiently low.

Next, it will be described how the crystal growth is affected by the growth temperature. In accordance with the growing method described above, a GaN layer was grown to be 2 $\mu$m thick on a GaN substrate at various growth temperatures in the range from about 750° C. to about 1100° C.

Figure 3:
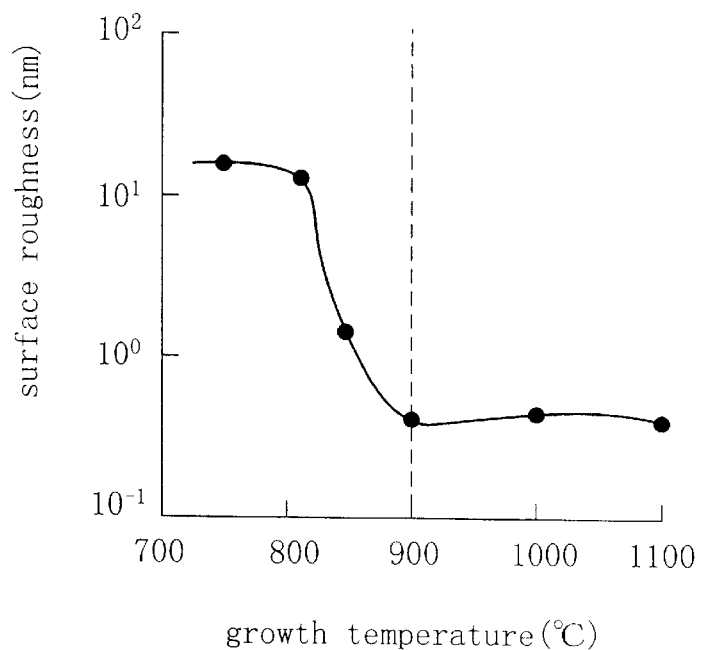
FIG. 3 is a graph illustrating the dependence of the surface roughness of a GaN layer grown by the method of the present invention on the growth temperature.

FIG. 3 illustrates the results obtained by measuring the surface roughness of the GaN layers grown at respective growth temperatures by an atomic force microscope (AFM), i.e., the dependence of the surface roughness of the grown layer on the growth temperature. As can be seen from FIG. 3, when the growth temperature is lower than about 900° C., the surface of the grown layer is very uneven. In contrast, when the growth temperature is about 900° C. or more, the surface is substantially flat. The uneven surface is formed at a temperature less than about 900° C., because the grown layer becomes polycrystalline when the growth temperature is low. In other words, by epitaxially growing a GaN layer on a single crystalline nitride compound semiconductor substrate at a growth temperature of about 900° C. or more, a single crystalline layer of good quality can be grown. Although a single crystalline substrate is preferably used, a polycrystalline substrate may also be used so long as the plane orientations in the crystal growing plane are aligned.

For the purpose of comparison, a GaN buffer layer was grown to be 0.05 $\mu$m thick on a GaN substrate and a sapphire substrate, respectively, at a temperature of about 600° C., and then an $Al_{0.4}Ga_{0.6}N$ layer was grown to be 2 $\mu$m thick on each buffer layer.

As a result, although crack was observed in the AlGaN layer on the buffer layer grown on the sapphire substrate, no crack was observed in the AlGaN layer on the buffer layer grown on the GaN substrate. Cracking is caused in the AlGaN layer on the buffer layer grown on the sapphire substrate due to a difference in thermal expansion coefficient among the sapphire substrate, the buffer layer and the AlGaN layer when the sample is cooled down from the growth temperature to room temperature. In contrast, in stacking AlGaN on GaN, no cracking is caused, because the properties of these two types of compounds in terms of thermal expansion coefficient and lattice constant are very similar to each other. As described about the GaN layer, the AlGaN layer is also preferably grown at about 900° C. or more to obtain a sufficiently flat surface.

As mentioned above, in order to grow a single crystalline layer of $Al_xGa_{1-x}N$ (where $0 \leq x \leq 1$) of good quality, a single crystalline or polycrystalline substrate of $Al_\alpha Ga_{1-\alpha}N$ (where $0 \leq \alpha \leq 1$) should preferably be used because the lattice constants and thermal expansion coefficients are preferably matched with each other between the grown layer and the substrate. Alternatively, a substrate made of any other nitride compound semiconductor may also be used. The difference in lattice constant preferably accounts for about 3% or less of the lattice constant of the grown layer, and the difference in thermal expansion coefficient preferably accounts for about 20% or less of the thermal expansion coefficient of the grown layer.

EMBODIMENT 2

In accordance with a growing method according to a second exemplary embodiment of the present invention, a compound semiconductor, expressed by a general formula $In_yAl_zGa_{1-y-z}N$ (where $0 < y \leq 1$, $0 \leq z < 1$ and $0 \leq y+z \leq 1$), is grown on a nitride compound semiconductor substrate.

The method for growing a nitride compound semiconductor according to this embodiment may be implementable by an MOCVD process using the MOCVD apparatus shown in FIG. 1 as in the first embodiment. In accordance with the following exemplary method, an InGaN layer is grown on a single crystalline GaN substrate by using trimethylindium as another source gas in addition to trimethylgallium and ammonium source gases in the first embodiment. As for InGaN, if the growth temperature is lowered, then the composition thereof changes. However, in this embodiment, an InGaN layer with the same composition can be obtained by adjusting the flow rates of the respective source gases.

In accordance with the growing method described above, a GaN layer is grown to be 1 μm thick on a single crystalline GaN substrate at various growth temperatures in the range from about 600° C. to about 900° C.

Figure 4:
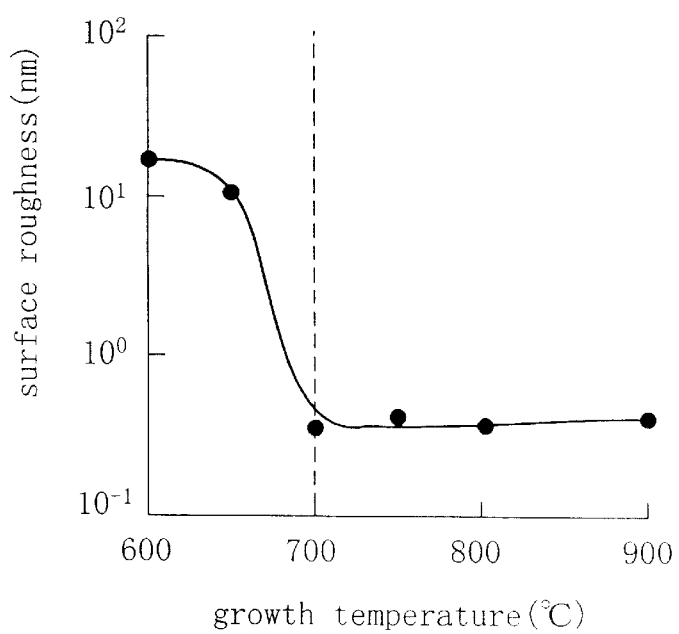
FIG. 4 is a graph illustrating the dependence of the surface roughness of an InGaN layer grown by the method of the present invention on the growth temperature.

FIG. 4 illustrates the results obtained by measuring the surface roughness of the InGaN layers (grown layers) grown at respective growth temperatures by an atomic force microscope (AFM), i.e., the dependence of the surface roughness of the grown layer on the growth temperature. As can be seen from FIG. 4, when the growth temperature is lower than about 700° C., the surface of the grown layer is very uneven. In contrast, when the growth temperature is about 700° C. or more, the surface is substantially flat. The uneven surface is formed at less than about 700° C., because the grown layer becomes polycrystalline when the growth temperature is low. In other words, by epitaxially growing an InGaN layer on a single crystalline nitride compound semiconductor substrate at a growth temperature of about 700° C. or more, a single crystal layer of good quality can be grown. Although a single crystalline substrate is preferably used, a polycrystalline substrate may also be used so long as the plane orientations in the crystal growing plane are aligned.

In this embodiment, an InGaN layer is grown for the illustrative purpose only. Alternatively, this growth technique is suitably applicable to the growth of an InAlGaN layer, because InAlGaN has substantially the same properties as those of InGaN. Also, since the melting point of InAlGaN is lower than that of AlGaN, the InAlGaN layer can be grown at a temperature lower than the AlGaN layer according to the first embodiment. Specifically, single crystals of good quality can be grown at a growth temperature of about 700° C. or more.

As described above, to grow a single crystalline layer of $In_yAl_zGa_{1-y-z}N$ (where $0 < y \leq 1$, $0 \leq z < 1$ and $0 \leq y+z$ 1) of good quality, a single crystalline or polycrystalline substrate of $In_\beta Al_\gamma Ga_{1-\beta-\gamma}N$ (where $0 < \beta \leq 1$, $0 \leq \gamma < 1$ and $0 \leq \beta+\gamma \leq 1$) is preferably used because the lattice constants and thermal expansion coefficients should be matched with each other between the grown layer and the substrate. Alternatively, a to substrate made of any other nitride compound semiconductor may also be used. The difference in lattice constant preferably accounts for about 3% or less of the lattice constant of the grown layer, and the difference in thermal expansion coefficient preferably accounts for about 20% or less of the thermal expansion coefficient of the grown layer.

(Effect of dislocation density in substrate)

An n-type GaN layer was grown on various p-type single crystalline substrates of GaN with mutually different dislocation densities. The carrier mobilities of the resulting n-type GaN layers (grown layers) were estimated by Hall measurement. The carrier density of the n-type GaN layer was set at $1 \times 10^{18}$ cm$^{-3}$ by doping the layer with Si. The conductivity types of the substrate and the grown layer were selected as above such that the carrier mobility could be estimated by Hall measurement.

Figure 5:
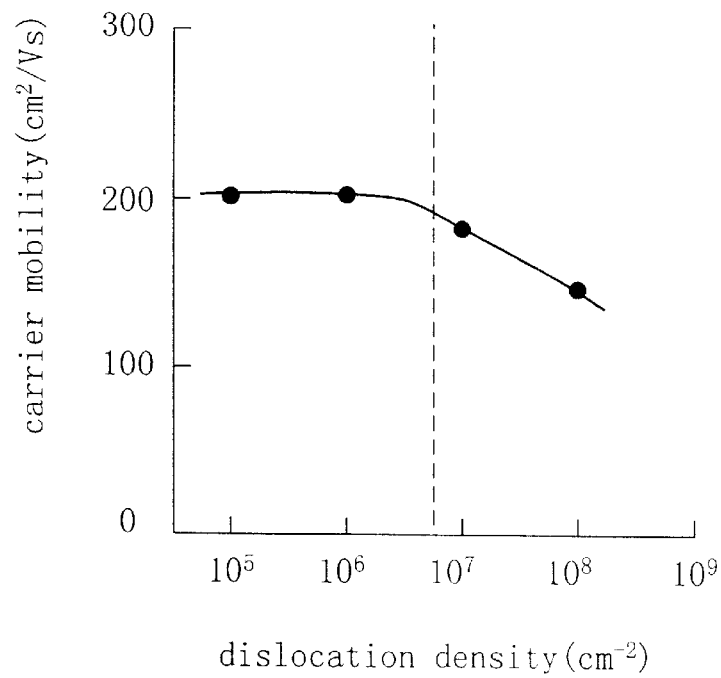
FIG. 5 is a graph illustrating the dependence of the carrier mobility in a layer grown by the method of the present invention on the dislocation density in the substrate.

FIG. 5 illustrates the dependence of the carrier mobility on the dislocation density in the substrate. As is clear from FIG. 5, as the dislocation density in the substrate decreases, the carrier mobility of the grown layer increases correspondingly. It is believed that the larger the carrier mobility, the better the crystallinity of the grown layer. When the dislocation density of the substrate is $1 \times 10^6$ cm$^{-2}$, the increase in carrier mobility is saturated and is constant thereafter. Accordingly, it can be understood that a single crystalline nitride compound semiconductor 8 of good crystallinity can be grown by setting the dislocation density in the substrate at about $1 \times 10^6$ cm$^{-2}$ or less.

(Effect of substrate thickness)

In accordance with a similar technique to that employed in the first embodiment, a GaN layer was grown on GaN single crystalline substrates with mutually different thicknesses and a diameter of 1 inch.

Figure 6:
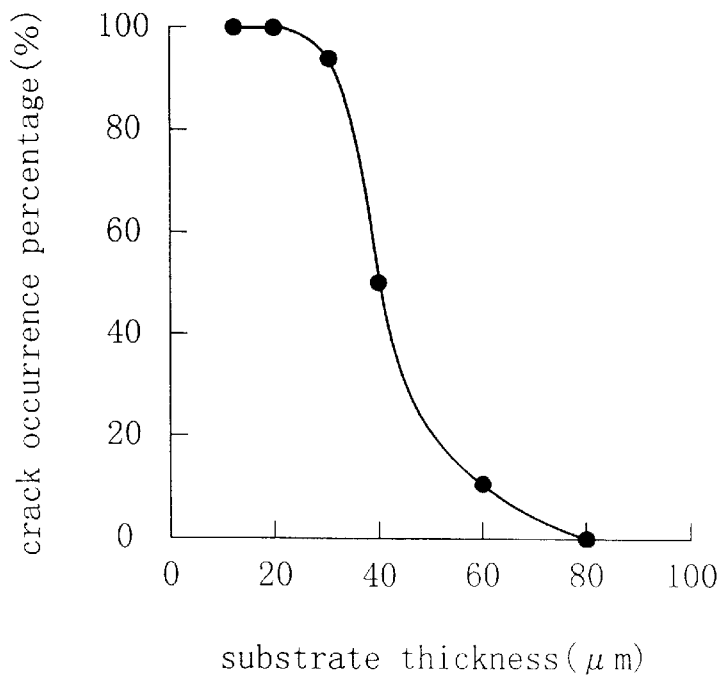
FIG. 6 is a graph illustrating the dependence of a percentage at which a substrate is cracked on the thickness of the substrate according to the present invention.

FIG. 6 illustrates a relationship between the percentage at which cracking occurs in the GaN substrate on which the GaN layer is grown and the thickness of the substrate. As can be seen from FIG. 6, the thinner the substrate, the higher the percentage of cracking occurrence. When the thickness of the substrate is less than about 30 μm, cracking occurs in almost all the substrates. In contrast, if the thickness of the substrate is about 60 μm or more, cracking occurs in less than 10% of the substrate, and a practical yield is attained. And if the thickness of the substrate is about 80 μm or more, higher yield can be obtained, because the percentage of cracking occurrence is less than 1%. A substrate with a practical strength can be obtained by setting the thickness thereof at about 30 μm or more, more preferably about 60 μm or more, and even more preferably about 80 μm or more.

As a matter of principle, such substrate cracking can be reduced by eliminating the non-uniform distribution of temperature in the substrate or by taking much more care in handling the substrate. However, in actuality, since a thin substrate is hard to handle, the thickness of the substrate is preferably equal to or larger than about 30 μm, more preferably equal to or larger than about 60 μm.

(Introduction of arsenic and phosphorus)

In accordance with substantially the same method as that of the first embodiment, a GaN layer (grown layer) 8 was grown by supplying AsH$_3$ gas or PH$_3$ gas in addition to the source gases or by supplying nothing but the source gases.

Figure 7:
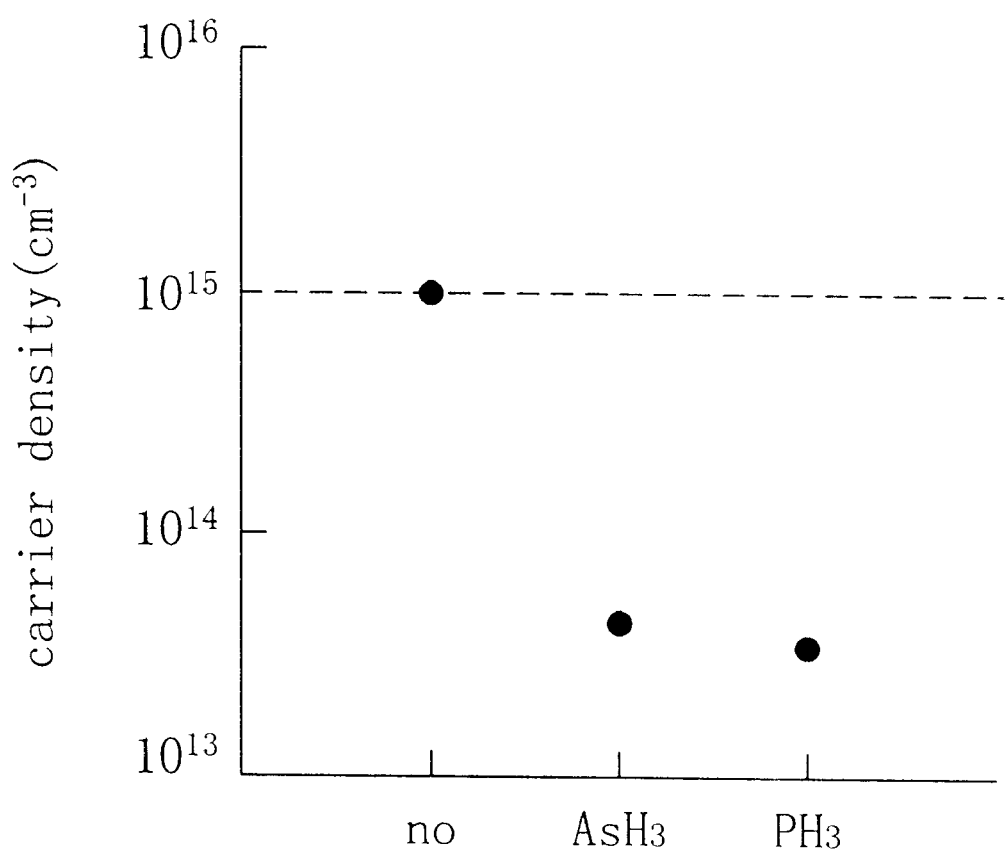
FIG. 7 is a graph illustrating how the carrier density is reduced by introducing As or P according to the present invention.

The respective carrier densities of these three types of grown layers are shown in FIG. 7. The flow rates of the ASH$_3$ and PH$_3$ gases were both 10 sccm and these gases were both supplied through the gas inlet port 5 (see FIG. 1). The conductivity types of the resulting undoped GaN layers were all n-type.

As is clear from FIG. 7, if arsenic (As) or phosphorus (P) is added during the growth, then the carrier density decreases. The GaN layers grown shows n-type conductivity because of the following reason. Since the vapor pressure of nitrogen (N) in GaN is high, N is absorbed into the grown layer with poor efficiency. As a result, N vacancy defects are likely to be formed in the grown layer and function as donor defects. The carrier density decreases by introducing As or P. This is because the N vacancies are compensated for by introducing As or P with a lower vapor pressure than that of N.

By introducing As or P with a lower vapor pressure than that of N into a nitride compound semiconductor layer during the growth thereof in this manner, N vacancies can be compensated for and the crystallinity can be further improved (or the number of defects can be reduced).

In the foregoing embodiment, element As or P is introduced as a compound containing the element into a nitride compound semiconductor layer during the growth thereof by an MOCVD process. In growing a nitride semiconductor layer by an MBE process, however, element As or P may be introduced into the layer as As or P molecules (i.e., As or P atoms).

The effect of a dislocation density in the substrate, the effect of the thickness of the substrate and the effect attained by the introduction of arsenic and phosphorus are described as to a growing method of the first embodiment. The same effects as those described in the first embodiment are also attainable by the method of the second embodiment if similar adjustments are made in these respects.

As is apparent from the foregoing description, the present invention provides a method for growing a nitride compound semiconductor on a substrate without causing defects between the interface of a substrate and the grown layer. Accordingly, if a short-wavelength light-emitting diode or the like is fabricated using a nitride semiconductor grown by this method, then the performance and the reliability of the device can be remarkably improved.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for growing a nitride compound semiconductor comprising the step of growing a compound semiconductor expressed by a general formula Al$_x$Ga$_{1-x}$N (where $0 \leq x \leq 1$) on a substrate composed of a single crystalline nitride compound semiconductor at a temperature of about 900° C. or more.

2. The method of claim 1, wherein a mobility of the nitride compound semiconductor is about 200 cm$^2$/Vs or more.

3. The method of claim 1, wherein the thickness of the substrate is about 30 µm or more.

4. The method of claim 1, wherein either arsenic or a compound containing arsenic is supplied onto the substrate such that N vacancies are compensated, while the compound semiconductor is being grown on the substrate.

5. The method of claim 1, wherein either phosphorus or a compound containing phosphorus is supplied onto the substrate such that N vacancies are compensated, while the compound semiconductor is being grown on the substrate.

6. A method for growing a nitride compound semiconductor comprising the step of growing a compound semiconductor expressed by a general formula In$_y$Al$_z$Ga$_{1-y-z}$N (where $0 < y \leq 1$, $0 \leq z < 1$ and $0 \leq y+z \leq 1$) on a substrate composed of a single crystalline nitride compound semiconductor at a temperature of about 700° C. or more.

7. The method of claim 6, wherein a mobility of the nitride compound semiconductor is about 200 cm$^2$/Vs or more.

8. The method of claim 6, wherein the thickness of the substrate is about 30 µm or more.

9. The method of claim 6, wherein either arsenic or a compound containing arsenic is supplied onto the substrate such that N vacancies are compensated, while the compound semiconductor is being grown on the substrate.

10. The method of claim 6, wherein either phosphorus or a compound containing phosphorus is supplied onto the substrate such that N vacancies are compensated, while the compound semiconductor is being grown on the substrate.

11. The method of claim 1, wherein the growing step is performed such that a surface roughness of the grown compound semiconductor is about 1 nm or less.

12. The method of claim 6, wherein the growing step is performed such that a surface roughness of the grown compound semiconductor is about 1 nm or less.

13. A method for growing a nitride compound semiconductor comprising the step of growing a compound semiconductor expressed by a general formula Al$_x$G$_{1-x}$N (where $0 \leq x \leq 1$) on a nitride compound semiconductor such that a surface roughness of the grown compound semiconductor is about 1 nm or less.

14. A method for growing a nitride compound semiconductor comprising the step of growing a compound semiconductor expressed by a general formula In$_y$Al$_z$Ga$_{1-y-z}$N (where $0 < y \leq 1$, $0 \leq z < 1$ and $0 \leq y+z \leq 1$) on a nitride compound semiconductor such that a surface roughness of the grown compound semiconductor is about 1 nm or less.

\* \* \* \* \*